(12) United States Patent
Chen et al.

(10) Patent No.: US 12,745,630 B2
(45) Date of Patent: Sep. 22, 2026

(54) ELECTRONIC PACKAGE WITH IMPROVED HEAT DISSIPATING AND MANUFACTURING METHOD THEREOF

(71) Applicant: SILICONWARE PRECISION INDUSTRIES CO., LTD., Taichung City (TW)

(72) Inventors: Chiu-Ling Chen, Taichung City (TW); Shuai-Lin Liu, Taichung City (TW); Pin-Jing Su, Taichung City (TW); Yi-Min Fu, Taichung City (TW); Lung-Yuan Wang, Taichung City (TW)

(73) Assignee: SILICONWARE PRECISION INDUSTRIES CO., LTD., Taichung City (TW)

( * ) Notice: Subject to any disclaimer, the term of this patent is extended or adjusted under 35 U.S.C. 154(b) by 445 days.

(21) Appl. No.: 18/448,515

(22) Filed: Aug. 11, 2023

(65) Prior Publication Data

US 2024/0421026 A1 Dec. 19, 2024

(30) Foreign Application Priority Data

Jun. 15, 2023 (TW) ................................ 112122426

(51) Int. Cl.
*H10W 72/00* (2026.01)
*H10W 40/22* (2026.01)
(Continued)

(52) U.S. Cl.
CPC ...... *H10W 40/22* (2026.01); *H10W 72/07336* (2026.01); *H10W 72/07354* (2026.01);
(Continued)

(58) Field of Classification Search
CPC ........... H10W 40/22; H10W 72/07336; H10W 72/07354; H10W 72/347; H10W 72/387; H10W 72/877; H10W 72/952; H10W 72/15; H10W 72/724; H10W 72/734; H10W 40/226; H10W 40/228; H10W 40/231; H10W 40/233; H10W 40/235;
(Continued)

(56) References Cited

U.S. PATENT DOCUMENTS 6,930,386 B1 * 8/2005 Cesulka .............. H10W 40/228 438/117
2002/0175403 A1 * 11/2002 Sreeram ................ H10W 40/70 257/702

(Continued)

*Primary Examiner* — William B Partridge
*Assistant Examiner* — Gustavo G Ramallo
(74) *Attorney, Agent, or Firm* — Studebaker Brackett PLLC

(57) ABSTRACT

An electronic package and a manufacturing method thereof are provided, in which an electronic element is disposed on a carrier structure, a heat conduction layer is formed on the electronic element, and a heat dissipation member having a recess portion is disposed on the heat conduction layer to cover the electronic element. Therefore, the arrangement of the recess portion can buffer the flow of the heat conduction layer to facilitate the formation of an intermetallic structure with sufficient thickness between the heat dissipation member and the electronic element, and the heat dissipation effect of the electronic element can meet expectations.

18 Claims, 6 Drawing Sheets

(51) Int. Cl.
*H10W 72/90* (2026.01)
*H10W 74/15* (2026.01)
*H10W 90/00* (2026.01)
*H10W 72/30* (2026.01)

(52) U.S. Cl.
CPC ........ *H10W 72/347* (2026.01); *H10W 72/387* (2026.01); *H10W 72/877* (2026.01); *H10W 72/952* (2026.01); *H10W 74/15* (2026.01); *H10W 90/724* (2026.01); *H10W 90/734* (2026.01)

(58) Field of Classification Search
CPC ............. H10W 40/237; H10W 40/242; H10W 40/258; H10W 95/00
See application file for complete search history.

(56) References Cited

U.S. PATENT DOCUMENTS

2005/0056926 A1* 3/2005 Chen ..................... H10W 40/10 257/E23.101
2011/0291258 A1* 12/2011 Murayama .......... H10W 40/258 165/185

* cited by examiner

ELECTRONIC PACKAGE WITH IMPROVED HEAT DISSIPATING AND MANUFACTURING METHOD THEREOF

BACKGROUND

1. Technical Field

The present disclosure relates to a package structure, and more particularly, to an electronic package with a heat dissipation member and a manufacturing method thereof.

2. Description of Related Art

With the improvement of the function and processing speed of electronic products, semiconductor chips, which are the core components of electronic products, need to have higher density electronic elements and electronic circuits, so a greater amount of heat energy is then generated by semiconductor chips during operation. Furthermore, the conventional encapsulant covering the semiconductor chips is made of a poor heat transfer material with a thermal conductivity of only 0.8 $W \cdot m^{-1} \cdot k^{-1}$ (i.e., the heat dissipation efficiency is not good); therefore, if the heat generated by the semiconductor chips cannot be effectively dissipated, it would cause damage to the semiconductor chips and product reliability issues.

Therefore, in order to quickly dissipate heat to the outside, a heat sink (or a heat spreader) is usually configured in the semiconductor package in the industry. The heat sink is usually bonded to the back of the semiconductor chip via a heat dissipation adhesive such as a thermal interface material (TIM), and the top surface of the heat sink is usually exposed from the encapsulant or directly exposed to the atmosphere, so that the heat generated by the semiconductor chip can be dissipated by the heat dissipation adhesive and the heat sink.

As shown in FIG. 1, in the manufacturing method of a conventional semiconductor package 1, a semiconductor chip 11 is first disposed on a packaging substrate 10 with an active surface 11*a* thereof in a manner of flip-chip bonding (i.e., via conductive bumps 110 and an underfill 111), and then a heat dissipation member 13 is bonded on an inactive surface 11*b* of the semiconductor chip 11 with a top sheet 130 thereof by a TIM layer 12, and supporting legs 131 of the heat dissipation member 13 are erected on the packaging substrate 10 via an adhesive layer 14. Next, the encapsulation molding operation is proceeded, so that the semiconductor chip 11 and the heat dissipation member 13 are covered by the encapsulant (not shown), and the top sheet 130 of the heat dissipation member 13 is exposed from the encapsulant.

During operation, the heat energy generated by the semiconductor chip 11 is conducted to the top sheet 130 of the heat dissipation layer 13 via the inactive surface 11*b* and the TIM layer 12 so as to be dissipated to the outside of the semiconductor package 1.

Moreover, in the manufacturing process of the conventional semiconductor package 1, the supporting legs 131 of the heat dissipation member 13 are directly pasted on the packaging substrate 10 usually after the adhesive layer 14 is heated and glued on the packaging substrate 10, such that the adhesive layer 14 generates the adhesive force after being cooled down to stick the packaging substrate 10 with the heat dissipation member 13.

However, in the conventional semiconductor package 1, the TIM layer 12 is made of a liquid metal with a high thermal conductivity (86 W/mK), which is solid at room temperature and melted at high temperature to have fluidity during the reflow process, so the TIM layer 12 will spread rapidly on the top sheet 130 of the heat dissipation member 13, making it difficult to form an intermetallic structure with sufficient thickness between the heat dissipation member 13 and the semiconductor chip 11, resulting in a poor heat conduction effect of the TIM layer 12, such that the heat dissipation effect of the semiconductor chip 11 does not meet expectations.

Furthermore, since the TIM layer 12 will spread rapidly on the top sheet 130 of the heat dissipation member 13, the TIM layer 12 cannot contact the whole inactive surface 11*b* of the semiconductor chip 11, so that a connection area between the TIM layer 12 and the semiconductor chip 11 is reduced and the intermetallic structure is prone to breakage, which results in poor heat dissipation performance and product reliability. Moreover, the TIM layer 12 may even overflow onto the packaging substrate 10 or the active surface 11*a* of the semiconductor chip 11, resulting in the problem of electrical short circuit.

Therefore, there is a need for a solution that addresses the aforementioned shortcomings in the prior art.

SUMMARY

In view of the aforementioned shortcomings of the prior art, the present disclosure provides an electronic package, comprising: a carrier structure; an electronic element disposed on the carrier structure; a heat conduction layer formed on the electronic element; and a heat dissipation member having a recess portion and disposed on the heat conduction layer, and the heat dissipation member covering the electronic element, wherein an opening of the recess portion faces the electronic element, the heat dissipation member is bonded to the heat conduction layer via a heat dissipation layer, and the heat dissipation layer extends onto a wall surface of the recess portion.

The present disclosure also provides a method of manufacturing an electronic package, comprising: disposing an electronic element on a carrier structure; forming a heat conduction layer on the electronic element; and disposing a heat dissipation member having a recess portion on the heat conduction layer to cover the electronic element, wherein an opening of the recess portion faces the electronic element, the heat dissipation member is bonded to the heat conduction layer via a heat dissipation layer, and the heat dissipation layer extends onto a wall surface of the recess portion.

In the aforementioned electronic package and method, the recess portion has an annular shape and surrounds the heat conduction layer. For example, the recess portion has a continuous annular shape or a discontinuous annular shape. Further, the recess portion comprises a trench with a rectangular contour, four strip-shaped trenches, or two oppositely arranged L-shaped trenches.

In the aforementioned electronic package and method, a vertical projected area of the electronic element relative to the carrier structure is located in the annular shape of the recess portion.

In the aforementioned electronic package and method, a vertical projected area of the electronic element relative to the carrier structure is equal to a layout outline area of the recess portion on the heat dissipation member.

In the aforementioned electronic package and method, a vertical projected area of the electronic element relative to the carrier structure is less than a layout outline area of the recess portion on the heat dissipation member.

In the aforementioned electronic package and method, the heat conduction layer is made of a liquid metal.

In the aforementioned electronic package and method, the heat dissipation layer is a gold layer.

As can be understood from the above, in the electronic package and the manufacturing method thereof according to the present disclosure, the flow of the heat conduction layer is buffered by the arrangement of the recess portion. Therefore, compared with the prior art, the heat conduction layer is limited by the recess portion and can be spread slowly on the heat dissipation member when the heat conduction layer has fluidity after high-temperature melting during the reflow process, so as to facilitate the formation of an intermetallic structure with sufficient thickness between the heat dissipation member and the electronic element and effectively improve the heat conduction effect of the heat conduction layer, such that the heat dissipation effect of the electronic element can meet expectations.

Furthermore, since the heat conduction layer spreads slowly on the heat dissipation member, the heat conduction layer can contact the expected place of the electronic element, so as to increase the connection area between the heat conduction layer and the electronic element, and the problem of breakage of the intermetallic structure will not occur, so that the heat dissipation performance and product reliability of the electronic package can be improved, and the problem of electrical short circuit caused by the overflow of the heat conduction layer onto the carrier structure or other parts of the electronic element can even be avoided.

DETAILED DESCRIPTION

Figure 1:
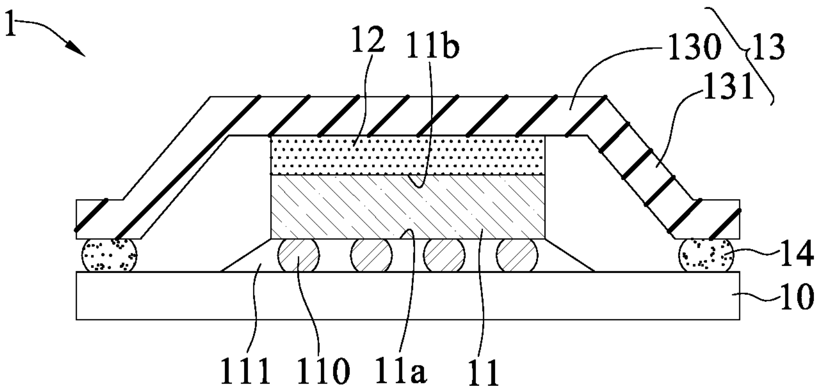
FIG. 1 is a schematic cross-sectional view of a conventional semiconductor package.

Implementations of the present disclosure are described below by embodiments. Other advantages and technical effects of the present disclosure can be readily understood by one of ordinary skill in the art upon reading the disclosure of this specification.

It should be noted that the structures, ratios, sizes shown in the drawings appended to this specification are provided in conjunction with the disclosure of this specification in order to facilitate understanding by those skilled in the art. They are not meant, in any ways, to limit the implementations of the present disclosure, and therefore have no substantial technical meaning. Without influencing the effects created and objectives achieved by the present disclosure, any modifications, changes or adjustments to the structures, ratios, or sizes are construed as falling within the scope covered by the technical contents disclosed herein. Meanwhile, terms such as "on," "above," "first," "second," "a," "one," and the like, are for illustrative purposes, and are not meant to limit the scope implementable by the present disclosure. Any changes or adjustments made to the relative relationships, without substantially modifying the technical contents, are also to be construed as within the scope implementable by the present disclosure.

FIG. 2A to FIG. 2D are schematic cross-sectional views illustrating a manufacturing method of an electronic package 2 of the present disclosure.

Figure 2A:
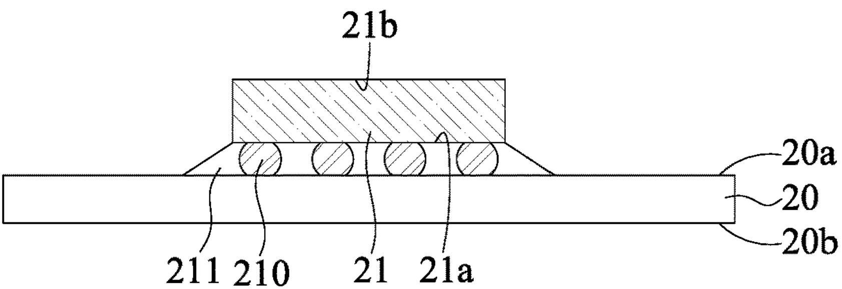
FIG. 2A to FIG. 2D are schematic cross-sectional views illustrating a manufacturing method of an electronic package of the present disclosure.

As shown in FIG. 2A, a carrier structure 20 is provided and has a first side 20*a* and a second side 20*b* opposing the first side 20*a*, and at least one electronic element 21 is disposed on the first side 20*a* of the carrier structure 20.

The carrier structure 20 can be, for example, a packaging substrate with a core layer and a circuit portion or a coreless circuit structure.

In an embodiment, the carrier structure 20 comprises at least one dielectric layer and a circuit layer bonded to the dielectric layer, such as of a fan-out redistribution layer (RDL) specification. For example, the first side 20*a* of the carrier structure 20 is used as a die mounting side for carrying the electronic element 21, and the second side 20*b* of the carrier structure 20 is used as a ball placement side.

It should be understood that the carrier structure 20 may also be other carrier units capable of carrying chips, such as lead frames, wafers, silicon interposers, or other board bodies with metal routings, etc., but not limited to the above.

The electronic element 21 is an active element, a passive element, or a combination of the active element and the passive element, and the active element is such as a semiconductor chip, and the passive element is such as a resistor, a capacitor, or an inductor.

In an embodiment, the electronic element 21 is a semiconductor chip and has an active surface 21*a* and an inactive surface 21*b* opposing the active surface 21*a*, and a plurality of electrode pads are formed on the active surface 21*a*, so that the electrode pads are bonded with and electrically connected to the circuit layer of the carrier structure 20 in a manner of flip-chip by a plurality of conductive bumps 210 such as solder materials, and then an encapsulation layer such as an underfill 211 is filled and formed between the first side 20*a* of the carrier structure 20 and the active surface 21*a* of the electronic element 21 to cover the conductive bumps 210.

In other embodiments, the electronic element 21 can also be electrically connected to the circuit layer of the carrier structure 20 by a plurality of bonding wires (not shown) in a wire-bonding manner; or, the electronic element 21 can directly contact the circuit layer of the carrier structure 20.

It should be understood that there are many ways of electrically connecting the electronic element 21 to the carrier structure 20, and the required type and quantity of the electronic element 21 that can be placed on the carrier structure 20 are not limited to the above.

Figure 2B:
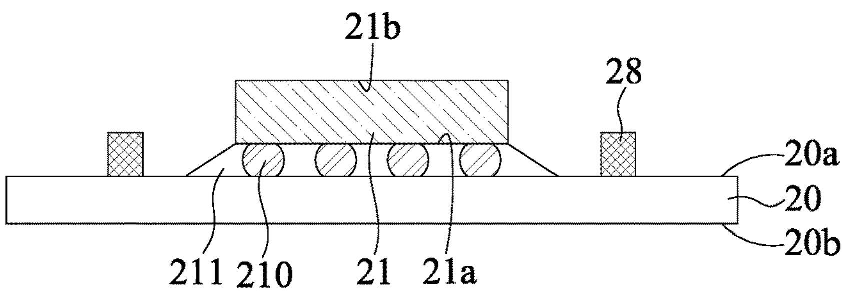

As shown in FIG. 2B, at least one passive element 28 is disposed on the carrier structure 20, so that the passive element 28 is electrically connected to the circuit layer.

Figure 2C:
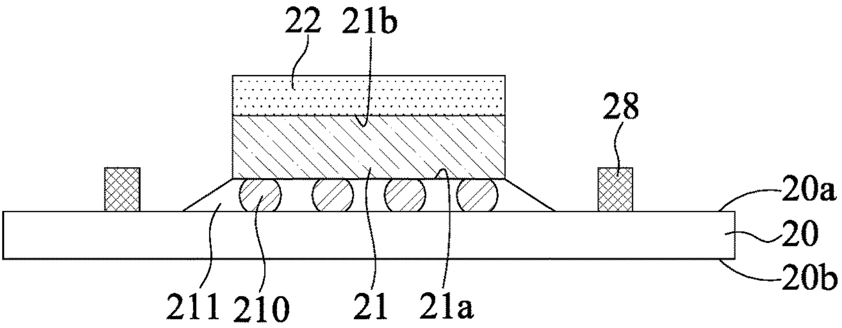

As shown in FIG. 2C, a heat conduction layer 22 is formed on the inactive surface 21*b* of the electronic element 21.

In an embodiment, the heat conduction layer 22 is used as a thermal interface material (TIM). For example, the heat conduction layer 22 can be made of a liquid metal such as a solder material, which has high thermal conductivity.

Figure 2D:
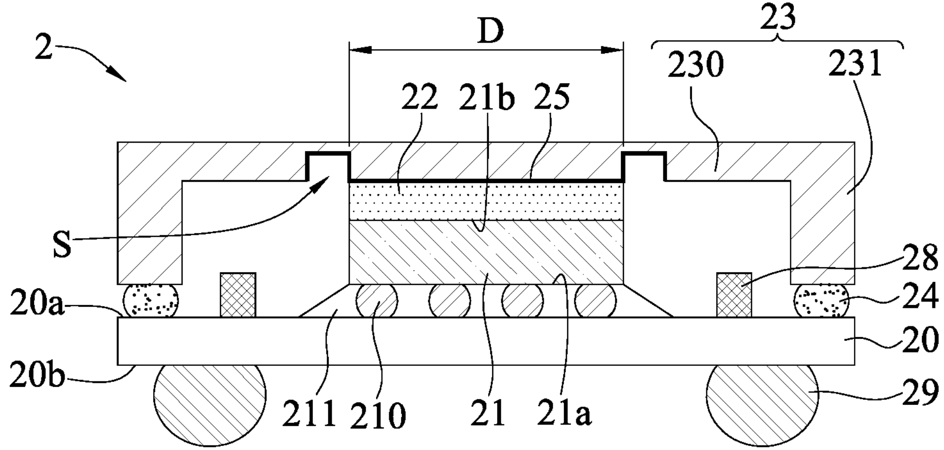

As shown in FIG. 2D, a heat dissipation member 23 with a recess portion S is disposed on the first side 20*a* of the carrier structure 20 and the heat conduction layer 22 to cover the electronic element 21, and an opening of the recess portion S faces the electronic element 21. Afterward, a plurality of conductive elements 29, such as metal pillars (e.g., copper pillars), metal bumps covered with insulating blocks, solder balls, solder balls with copper core balls, or other conductive structures, can be disposed on the second side 20*b* of the carrier structure 20 to obtain the electronic package 2 of the present disclosure, and subsequently the electronic package 2 can be connected to an electronic device such as a circuit board (not shown) via the conductive elements 29.

In an embodiment, the heat dissipation member 23 has a heat dissipation body 230 in contact with and bonded to the heat conduction layer 22 and a plurality of supporting legs 231 extending downward from the edge of the heat dissipation body 230 to connect with the carrier structure 20. For example, the heat dissipation body 230 is in the form of a sheet, which can press the heat conduction layer 22 (i.e., liquid metal) by a heat dissipation layer 25, so that the heat conduction layer 22 (i.e., liquid metal) is located between the heat dissipation body 230 and the electronic element 21. Further, the heat dissipation layer 25 is a metal layer (e.g., made of gold) and is coated on the heat dissipation body 230 and extends onto the wall surface of the recess portion S.

Furthermore, the supporting legs 231 are bonded on the carrier structure 20 via an adhesive layer 24. For example, the adhesive layer 24 is first formed on the first side 20*a* of the carrier structure 20 by dispensing, so that the adhesive layer 24 is located at the periphery of the passive element 28, and then the supporting legs 231 are adhesively bonded onto the adhesive layer 24 to fix the heat dissipation member 23 on the carrier structure 20.

Figure 3A:
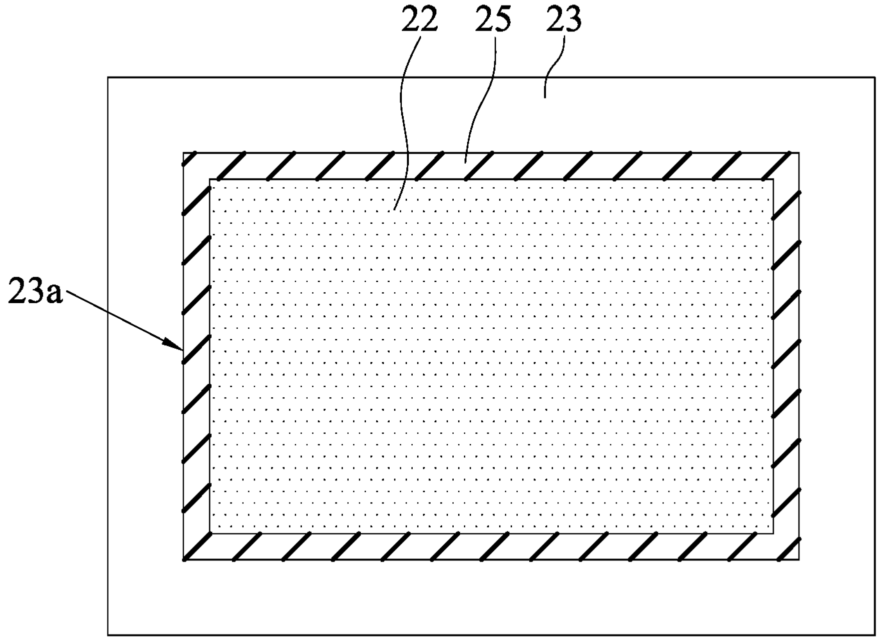
FIG. 3A is a schematic partial top view of FIG. 2D.
Figure 3B:
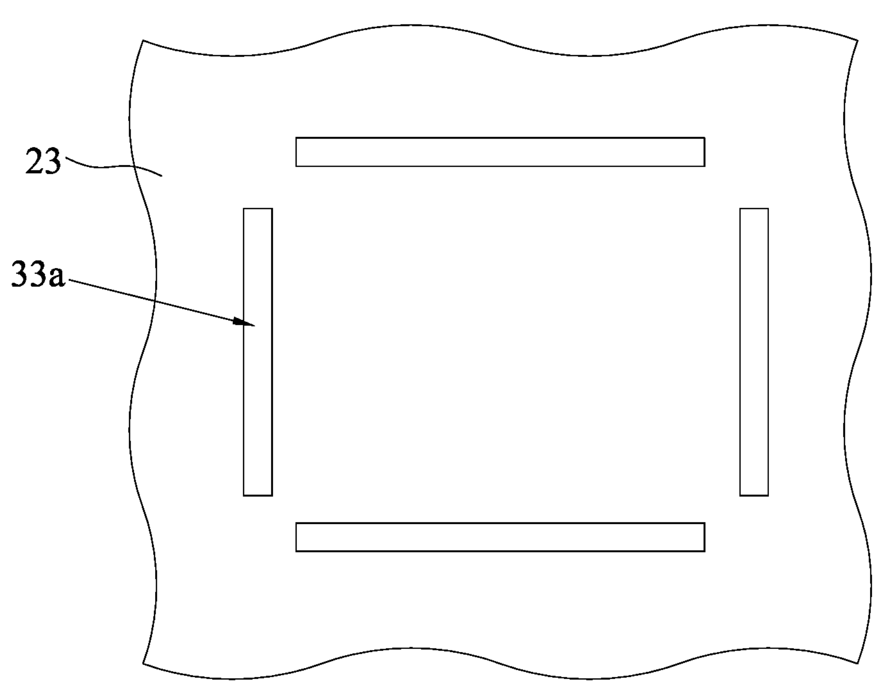
FIG. 3B and FIG. 3C are schematic partial top views showing other embodiments of FIG. 2D.
Figure 3C:
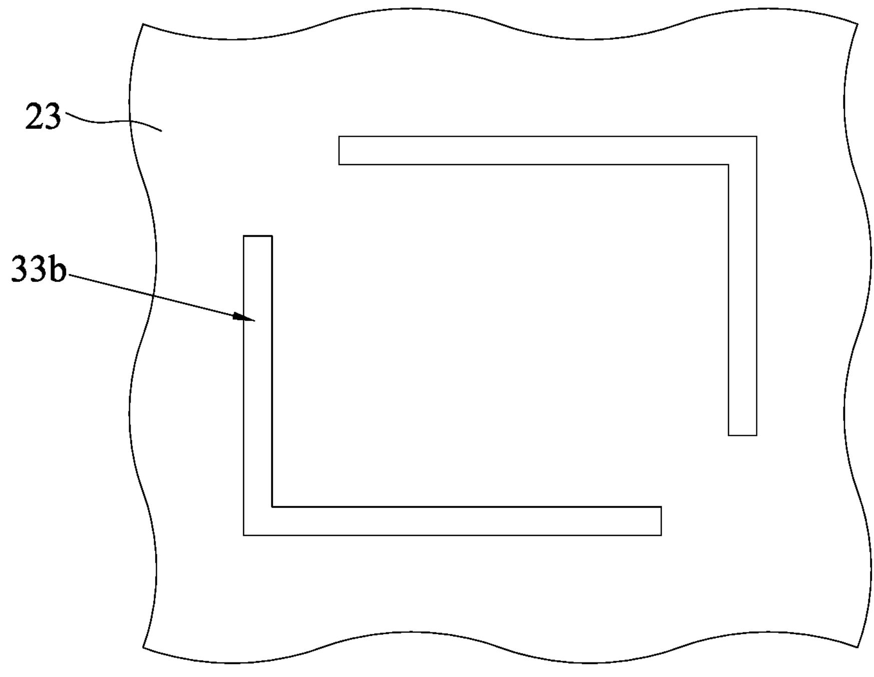

Also, the recess portion S has a continuous annular shape, such as a trench 23*a* with a rectangular contour shown in FIG. 3A, which surrounds the heat conduction layer 22, so that a vertical projected area D of the inactive surface 21*b* of the electronic element 21 relative to the first side 20*a* of the carrier structure 20 is located in the annular shape of the recess portion S. In other embodiments, the recess portion S has a discontinuous annular shape, such as four strip-shaped trenches 33*a* shown in FIG. 3B or two oppositely arranged L-shaped trenches 33*b* shown in FIG. 3C.

Figure 4A:
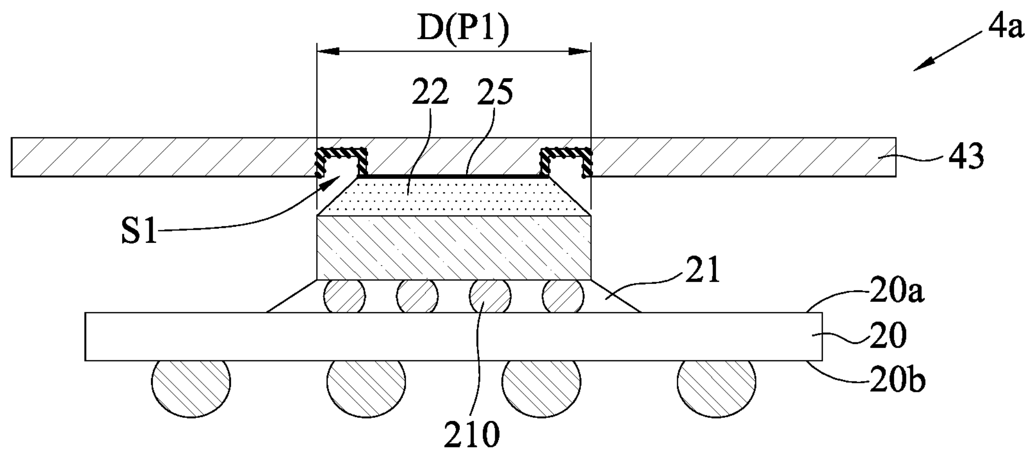
FIG. 4A is a schematic cross-sectional view showing another embodiment of FIG. 2D.
Figure 4B:
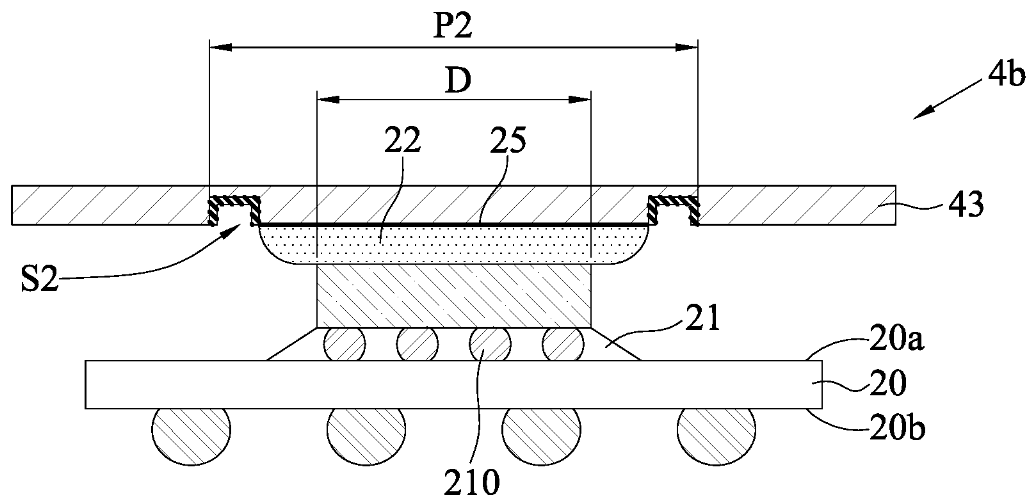
FIG. 4B is a schematic cross-sectional view showing other embodiments of FIG. 4A.

Moreover, in an electronic package 4*a* as shown in FIG. 4A, in another embodiment, a heat dissipation member 43 can also be a sheet body without the supporting legs 231, and the vertical projected area D of the inactive surface 21*b* of the electronic element 21 relative to the first side 20*a* of the carrier structure 20 can be equal to a layout outline area P1 of the recess portion S on the heat dissipation member 43. In other embodiments, in an electronic package 4*b* as shown in FIG. 4B, the vertical projected area D of the inactive surface 21*b* of the electronic element 21 relative to the first side 20*a* of the carrier structure 20 can also be less than a layout outline area P2 of the recess portion S on the heat dissipation member 43.

Therefore, in the electronic package 2, 4*a*, 4*b* of the present disclosure, due to the arrangement of the recess portion S, the volume of the heat conduction layer 22 (liquid metal) will expand and flow into the recess portion S when the temperature rises, thereby buffering the flow of the heat conduction layer 22 (liquid metal). Therefore, compared with the prior art, the heat conduction layer 22 is limited by the recess portion S and can be spread slowly on the heat dissipation member 23, 43 when the heat conduction layer 22 has fluidity after high-temperature melting during the reflow process, so as to facilitate the formation of an intermetallic structure with sufficient thickness between the heat dissipation member 23, 43 and the electronic element 21 and effectively improve the heat conduction effect of the heat conduction layer 22, such that the heat dissipation effect of the electronic element 21 can meet expectations.

Furthermore, since the heat conduction layer 22 (liquid metal) spreads slowly on the heat dissipation member 23, 43, the heat conduction layer 22 (liquid metal) can contact the whole inactive surface 21*b* of the electronic element 21, so as to increase the connection area between the heat conduction layer 22 and the electronic element 21, and the problem of breakage of the intermetallic structure will not occur, so that the heat dissipation performance and product reliability of the electronic package 2, 4*a*, 4*b* can be improved, and the problem of electrical short circuit caused by the overflow of the heat conduction layer 22 (liquid metal) onto the carrier structure 20 or the active surface 21*a* of the electronic element 21 can even be avoided.

In addition, the design of the heat dissipation layer 25 facilitates the acceleration of the heat dissipation rate, such that the electronic package 2, 4*a*, 4*b* meet the requirements of high heat dissipation.

The present disclosure further provides an electronic package 2, 4*a*, 4*b*, which comprises: a carrier structure 20, at least one electronic element 21 disposed on the carrier structure 20, a heat conduction layer 22 disposed on the electronic element 21, and a heat dissipation member 23, 43 disposed on the heat conduction layer 22 to cover the electronic element 21.

The heat dissipation member 23, 43 has a recess portion S and is bonded to the heat conduction layer 22 via a heat dissipation layer 25, and the heat dissipation layer 25 extends onto a wall surface of the recess portion S.

In one embodiment, the recess portion S has an annular shape and surrounds the heat conduction layer 22. For example, the recess portion S has a continuous annular shape or a discontinuous annular shape. Further, the recess portion S comprises a trench 23*a* with a rectangular contour, four strip-shaped trenches 33*a*, or two oppositely arranged L-shaped trenches 33*b*.

In one embodiment, a vertical projected area D of the electronic element 21 relative to the carrier structure 20 is located in the annular shape of the recess portion S.

In one embodiment, the vertical projected area D of the electronic element 21 relative to the carrier structure 20 is equal to a layout outline area P1 of the recess portion S on the heat dissipation member 43.

In one embodiment, the vertical projected area D of the electronic element 21 relative to the carrier structure 20 is less than a layout outline area P2 of the recess portion S on the heat dissipation member 43.

In one embodiment, the heat conduction layer 22 is made of a liquid metal.

In one embodiment, the heat dissipation layer 25 is a gold layer.

In view of the above, in the electronic package and the manufacturing method thereof, the flow of the heat conduction layer is buffered by the arrangement of the recess portion formed in the heat dissipation member. Therefore, the heat conduction layer can be spread slowly on the heat dissipation member when the heat conduction layer has fluidity so as to facilitate the formation of an intermetallic structure with sufficient thickness between the heat dissipation member and the electronic element and effectively improve the heat conduction effect of the heat conduction layer, such that the heat dissipation effect of the electronic element can meet expectations.

Furthermore, since the heat conduction layer spreads slowly on the heat dissipation member, the heat conduction layer can contact the whole inactive surface of the electronic element, so as to increase the connection area between the heat conduction layer and the electronic element, and the problem of breakage of the intermetallic structure will not occur, so that the heat dissipation performance and product reliability of the electronic package can be improved, and the problem of electrical short circuit caused by the overflow of the heat conduction layer onto the carrier structure or the active surface of the electronic element can even be avoided.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. An electronic package, comprising:
- a carrier structure;
- an electronic element disposed on the carrier structure;
- a heat conduction layer formed on the electronic element; and
- a heat dissipation member having a recess portion and disposed on the heat conduction layer, and the heat dissipation member covering the electronic element, wherein the recess portion has an annular shape and surrounds the heat conduction layer, an opening of the recess portion faces the electronic element, the heat dissipation member is bonded to the heat conduction layer via a heat dissipation layer, and the heat dissipation layer extends onto a wall surface of the recess portion.

2. The electronic package of claim 1, wherein the recess portion has a continuous annular shape.

3. The electronic package of claim 1, wherein the recess portion has a discontinuous annular shape.

4. The electronic package of claim 1, wherein the recess portion comprises a trench with a rectangular contour, four strip-shaped trenches, or two oppositely arranged L-shaped trenches.

5. The electronic package of claim 1, wherein a vertical projected area of the electronic element relative to the carrier structure is located in the annular shape of the recess portion.

6. The electronic package of claim 1, wherein a vertical projected area of the electronic element relative to the carrier structure is equal to a layout outline area of the recess portion on the heat dissipation member.

7. The electronic package of claim 1, wherein a vertical projected area of the electronic element relative to the carrier structure is less than a layout outline area of the recess portion on the heat dissipation member.

8. The electronic package of claim 1, wherein the heat conduction layer is made of a liquid metal.

9. The electronic package of claim 1, wherein the heat dissipation layer is a gold layer.

10. A method of manufacturing an electronic package, comprising:
- disposing an electronic element on a carrier structure;
- forming a heat conduction layer on the electronic element; and
- disposing a heat dissipation member having a recess portion on the heat conduction layer to cover the electronic element, wherein the recess portion has an annular shape and surrounds the heat conduction layer, an opening of the recess portion faces the electronic element, the heat dissipation member is bonded to the heat conduction layer via a heat dissipation layer, and the heat dissipation layer extends onto a wall surface of the recess portion.

11. The method of claim 10, wherein the recess portion has a continuous annular shape.

12. The method of claim 10, wherein the recess portion has a discontinuous annular shape.

13. The method of claim 10, wherein the recess portion comprises a trench with a rectangular contour, four strip-shaped trenches, or two oppositely arranged L-shaped trenches.

14. The method of claim 10, wherein a vertical projected area of the electronic element relative to the carrier structure is located in the annular shape of the recess portion.

15. The method of claim 10, wherein a vertical projected area of the electronic element relative to the carrier structure is equal to a layout outline area of the recess portion on the heat dissipation member.

16. The method of claim 10, wherein a vertical projected area of the electronic element relative to the carrier structure is less than a layout outline area of the recess portion on the heat dissipation member.

17. The method of claim 10, wherein the heat conduction layer is made of a liquid metal.

18. The method of claim 10, wherein the heat dissipation layer is a gold layer.

* * * * *